United States Patent
Duclos et al.

(10) Patent No.: US 6,882,180 B2
(45) Date of Patent: Apr. 19, 2005

(54) SWITCHING AID CIRCUIT FOR A LOGIC CIRCUIT

(75) Inventors: Franck Duclos, Tours (FR); Olivier Ladiray, Montlouis sur Loire (FR); Jérôme Heurtier, Tours (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/415,461

(22) PCT Filed: Oct. 30, 2001

(86) PCT No.: PCT/FR01/03380

§ 371 (c)(1),
(2), (4) Date: Apr. 29, 2003

(87) PCT Pub. No.: WO02/37681

PCT Pub. Date: May 10, 2002

(65) Prior Publication Data

US 2004/0021487 A1 Feb. 5, 2004

(30) Foreign Application Priority Data

Oct. 31, 2000 (FR) .......................................... 00 14001

(51) Int. Cl.[7] ..................... H03K 19/013; H03K 5/1534
(52) U.S. Cl. ............................ 326/84; 326/89; 327/482
(58) Field of Search ............................ 326/84, 89, 75, 326/18; 327/482, 574

(56) References Cited

U.S. PATENT DOCUMENTS 3,588,851 A * 6/1971 Jordan ........................ 365/243
3,889,137 A * 6/1975 Kay ............................. 327/482
4,584,490 A * 4/1986 West ............................ 327/374

OTHER PUBLICATIONS

International Search. Report from priority application No. PCT/FR01/03380, filed Oct. 30, 2001.
Patent Abstracts of Japan, vol. 007, No. 208 (E–198), Sep. 14, 1983 & JP 58 104532 A Jun. 22, 1998.
Patent Abstracts of Japan, vol. 013, No. 371 (E–807), Aug. 17, 1989 & JP 01 125108 A May 17, 1989.
Patent Abstracts of Japan, vol. 017, No. 245 (E–1365), May 17, 1993 & JP 04 369118 A Dec. 21, 1992.
Translation of International Preliminary Examination Report from PCT/FR01/03380, filed Oct. 30, 2001.

* cited by examiner

*Primary Examiner*—Daniel D. Chang
(74) *Attorney, Agent, or Firm*—Lisa K. Jorgenson; James H. Morris; Wolf, Greenfield & Sacks, P.C.

(57) ABSTRACT

The invention concerns a switching circuit (20) adapted to generate a pulse when there occurs a rising edge of a signal applied on an input terminal (CTRL), comprising: a first NPN type bipolar transistor (TN2) whereof the transmitter is connected to the input terminal; a second transistor (TP2) whereof a control electrode is connected, through a first resistor (Re2), to the input terminal, the base of the first transistor being connected to a supply potential (VDD) by the second transistor in series with a second resistor (Rp2); and a third transistor (TN3) connecting an output terminal (22) of the switching circuit to a reference potential (GND) and whereof a control electrode is connected to the collector of the first transistor (TN2).

10 Claims, 5 Drawing Sheets

SWITCHING AID CIRCUIT FOR A LOGIC CIRCUIT

BACKGROUND OF THE INVENTION

1. Field of the Invention

The present invention relates to the field of electronic circuits providing or exploiting a logic signal.

According to a first aspect, the present invention more specifically relates to the forming of a fast logic circuit, for example implementing a non-inverting function. This type of circuit is, for example, used to adapt the level of a logic input signal and is generally designated as a buffer.

2. Discussion of the Related Art

FIG. 1 shows the conventional symbol of such a logic circuit. Circuit 1 includes two supply terminals 2, 3 respectively connected to voltages VDD and GND, the latter generally representing the ground. An input terminal 4 of circuit 1 receives a logic signal IN. Circuit 1 provides, on an output terminal 5, a signal OUT having the same state as input signal IN.

FIG. 2 shows an example of an internal structure of a non-inverting logic circuit 1 in bipolar technology. This circuit essentially includes two transistors, TP1 of PNP type and TN1 of NPN type. Transistor TP1 is the input transistor. Its base is connected to terminal 4 by an input resistor Re1. The emitter of transistor TP1 is connected, by a biasing resistor Rp1, to terminal 2 at voltage VDD. The collector of transistor TP1 is connected to the base of transistor TN1. The emitter of transistor TN1 is connected to ground terminal 3. The collector of transistor TN1 forms output 5 terminal of circuit 1 and is connected, by a resistor Rn, to terminal 2.

The static operation of circuit 1 is the following. If input signal IN is low (ground GND), transistor TP1 is on. Transistor TN1 receives a base current. It is thus also on, and output signal OUT is also low. If the input signal is high (for example, voltage VDD), transistor TP1 is off. No base current is provided to transistor TN1, which is accordingly also off. Output signal OUT then is high, a current flowing through resistor Rn.

FIGS. 3A and 3B illustrate, with timing diagrams, the dynamic operation of the circuit of FIG. 1. FIG. 3A shows an example of the course of input signal IN. FIG. 3B illustrates the corresponding course of output signal OUT.

It is assumed that initially, signal IN is low and that it switches to a high state (voltage V1) at a time t1. The level of signal IN may be different from voltage VDD provided that it is (neglecting the voltage drop in resistor Re1) greater than VDD-VbeP, where VbeP represents the base-emitter voltage of transistor TP1 (approximately 0.6 V). Signal OUT takes a certain time to reach the high level (VDD, neglecting the voltage drop in resistor Rn). The time of switching to the high state (times t1 to t2) essentially depends on the time taken by output transistor TN1 to desaturate. Indeed, when transistor TP1 turns off, charges remain accumulated in the base of transistor TN1 and a certain time is necessary to evacuate them by leakage currents.

The desaturation time of transistor TN1 also depends on:

- the output impedance of circuit 1, which cannot be controlled in the forming of the logic circuit itself;
- the time taken by transistor TP1 to desaturate by evacuating the charges from its collector into the base of transistor TN1; and
- the base current received by transistors TN1 and TP1 upon switching to the low state. The greater these currents, the more time it takes for the transistors to desaturate.

In FIG. 3A, it is assumed that signal IN switches low at a time t3. The circuit switching is fast in this way and signal OUT reaches the low state at a time t4 close to time t3. Generally the time of switching to the low state is negligible (shorter than 100 nanoseconds). However, the output signal rise time is relatively long, for example, on the order of one microsecond.

A conventional solution to accelerate the rise time is to decrease the base current injected into transistor TN1 upon switching to the low state. For this purpose, the gain of transistor TP1 is decreased or its biasing resistance Rp1 is increased. However, the base current of transistor TN1 must respect the condition of being sufficient to enable its saturating, failing which the switching to the low state will not occur. Further, a significant base current enables fast switching to the high state. Accordingly, a compromise providing the above switching times must most often be made.

Another solution is to provide an additional resistor between the base and the emitter of transistor TN1. However, this solution only has a limited effect since the value of this resistance must still enable saturation of transistor TN1 upon switching to the low state. Further, it causes additional power consumption.

In some applications (for example, in applications where the input terminal may remain unconnected), it is generally desired to minimize the circuit power consumption when the input is high or unconnected. In the circuit of FIG. 2, this condition is fulfilled by the fact that, in the high state, both transistors TP1 and TN1 are off, the power consumption being then limited to that of resistor Rn.

SUMMARY OF THE INVENTION

According to its first aspect, the present invention aims at overcoming at least one of the disadvantages of a logic circuit implementing a conventional non-inverting function. The present invention aims, in particular, at improving the response time of such a logic circuit.

The present invention also aims at providing such a logic circuit that generates no additional power consumption when the input terminal is high or unconnected.

The present invention further aims at providing a solution which is compatible with a low supply voltage (typically, under 2 V).

According to a second aspect, the present invention aims at providing a circuit exploiting a logic signal for generating a voltage pulse of predetermined duration upon occurrence of a square pulse of this logic signal.

According to this second aspect, the present invention more specifically aims at providing a low-consumption circuit operating under a low voltage and which is easily integrable.

Conventionally, to generate a voltage pulse from a logic signal, capacitors are used. A disadvantage is that these capacitors are difficult to integrate or, to at the very least, occupy a significant space in the integrated circuit.

To achieve these and other objects, the present invention provides a switching circuit adapted to generating a pulse upon occurrence of a rising edge of a signal applied on an input terminal, including:

a first NPN-type bipolar transistor having its emitter connected to the input terminal;

a second transistor having a control electrode connected, by a first resistor, to the input terminal, the base of the first transistor being connected to a supply voltage by the second transistor in series with a second resistor; and a third transistor connecting an output terminal of the switching circuit to a reference voltage and having a control electrode connected to the collector of the first transistor.

According to an embodiment of the present invention, the first and second transistors are on in the quiescent state, while the third transistor is off in the quiescent state.

According to an embodiment of the present invention, the pulse duration is determined by the time taken by the second transistor to turn off through the base-collector junction of the first forward-biased transistor and temporarily turning on the third transistor.

According to an embodiment of the present invention, the first resistor takes part in the setting of the pulse duration.

According to an embodiment of the present invention, the second transistor is a bipolar PNP-type transistor.

According to an embodiment of the present invention, the third transistor is a bipolar NPN-type transistor.

The present invention also provides a logic circuit that provides a non-inverting function, including:

a bipolar PNP type input transistor having its emitter connected, by a biasing resistor, to a terminal of application of a positive voltage and having its base connected, by an input resistor, to a terminal of application of a logic signal;

a bipolar NPN type output transistor having its emitter connected to a terminal of application of a reference voltage, having its base connected to the collector of the input transistor and its collector forming an output terminal of the logic circuit connected, by an output resistor, to the terminal of application of the positive voltage; and a switching circuit having its output terminal connected to the base of the output transistor to accelerate its desaturation, the input terminal of the switching circuit being connected to the input terminal of the logic circuit.

According to an embodiment of the present invention, the second resistor is connected between the first transistor and the terminal of application of the positive voltage, the collector of the first transistor being directly connected to the base of the second transistor.

The present invention further provides a generator of pulses from a voltage square pulse applied on an input terminal, including a switching circuit having its output terminal forming an output terminal of the pulse generator connected, by a resistor, to a terminal of application of the most positive voltage.

According to an embodiment of the present invention, the collector of the first transistor is connected to the base of the second transistor by the second resistor conditioning the pulse duration.

The foregoing objects, features and advantages of the present invention, will be discussed in detail in the following non-limiting description of specific embodiments in connection with the accompanying drawings, in which:

DETAILED DESCRIPTION

Figure 3A:
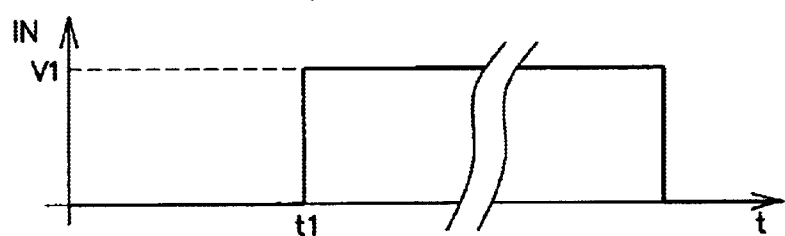
FIGS. 3A and 3B illustrate the operation of the conventional circuit of FIG. 2.
Figure 3B:
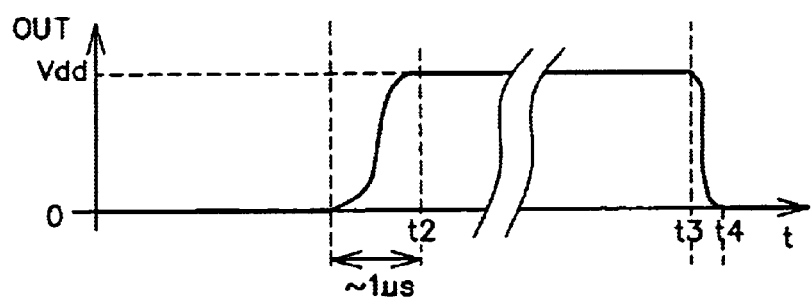

The same elements have been designated by same references in the different drawings. For clarity, the timing diagrams of FIGS. 3, 7 and 10 are not to scale.

Figure 4:
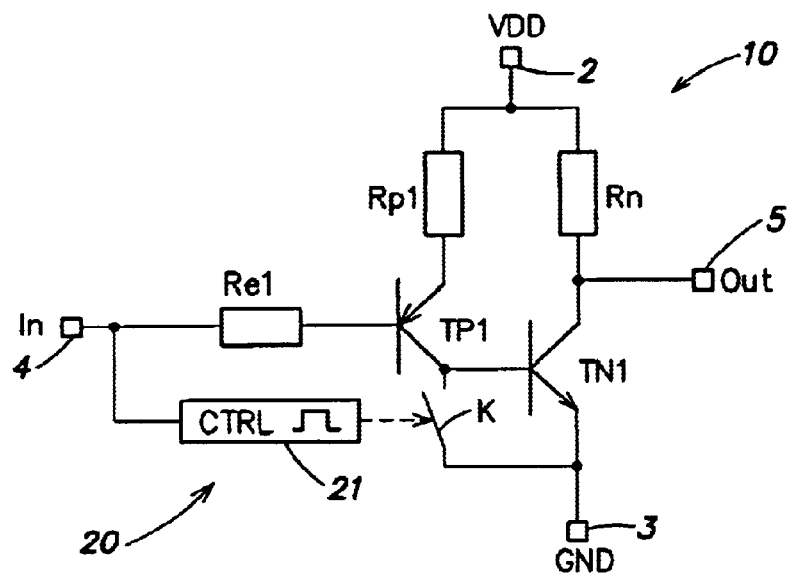
FIG. 4 partially shows in the form of blocks an embodiment of a logic circuit fulfilling a non-inverting function according to the first aspect of the present invention.

FIG. 4 shows a logic circuit 10 that provides a non-inverting function according to the first aspect of the present invention.

Figure 1:
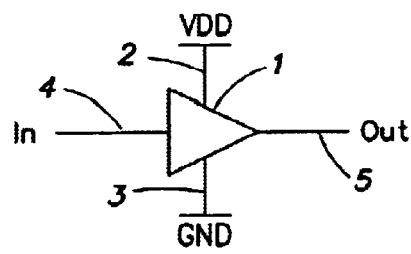
FIG. 1 shows the conventional symbol of a logic circuit to which the present invention according to its first aspect applies.
Figure 2:
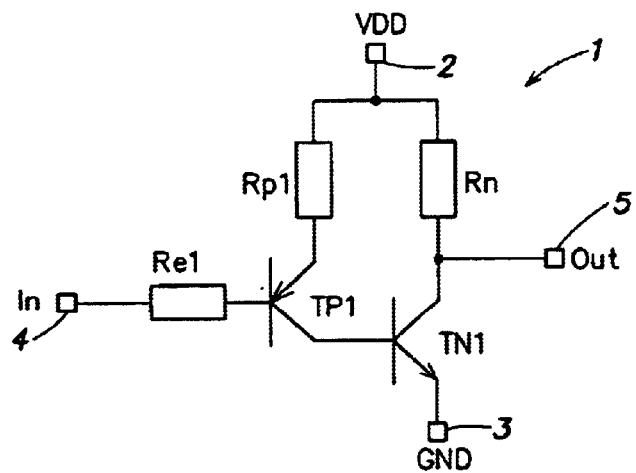
FIG. 2 shows the detailed electric diagram of a conventional logic circuit fulfilling a non-inverting function.

As previously, such a logic circuit 10 includes two supply terminals 2, 3. Terminal 2 is connected to a more positive voltage VDD. Terminal 3 is connected to a more negative voltage GND, for example, the ground. An input terminal 4 is intended for receiving a logic signal IN. An output terminal 5 is intended for providing a logic signal OUT corresponding to input signal IN. As previously still, an output branch of circuit 10 includes, in series between terminals 2 and 3, a resistor Rn and an NPN-type bipolar transistor TN1. The emitter of transistor TN1 is connected to ground terminal 3. Its collector is connected to terminal 5. The base of transistor TN1 is, as previously, connected to the collector of a PNP-type transistor TP1 having its emitter connected, by a biasing resistor Rp1, to terminal 2. The base of transistor TP1 is connected, by an input resistor Re1, to terminal 4. All the preceding structure corresponds to the electric diagram of a conventional circuit (1, FIG. 2).

A feature of the present invention is to provide a switching circuit 20 for forcing the desaturation of output transistor TN1 and thus helping the switching of logic circuit 10. Circuit 20 includes a switch K connecting the base of transistor TN1 to ground 3 and a circuit 21 for controlling switch K. Circuit 21 includes a control terminal CTRL which is connected to input terminal 4 of circuit 10 receiving the logic circuit to be processed.

The function of control circuit 21 is to generate a turn-on pulse for switch K upon each rising edge of input signal IN. A pulse control has several advantages.

First, the circuit operation in a switching to the low state is dissociated from its operation in a switching to the high state. For a switching to the low state, the circuit operation is not modified, switch K remaining off. A sufficient base current to properly saturate the input stage can thus be provided. For a switching to the low state, the controlled turning-on of switch K enables controlling the desaturation of transistor TN1, and thus the switching speed, independently from the speed of switching to the high state.

Further, in static operation, any power consumption is avoided in the input stage (transistor TP1) when the input signal is high.

According to the present invention, a turn-on pulse duration of switch K which is sufficient to help the desaturation not only of transistor TN1 upon a switching to the low state, but also of transistor TP1, is provided.

Figure 5:
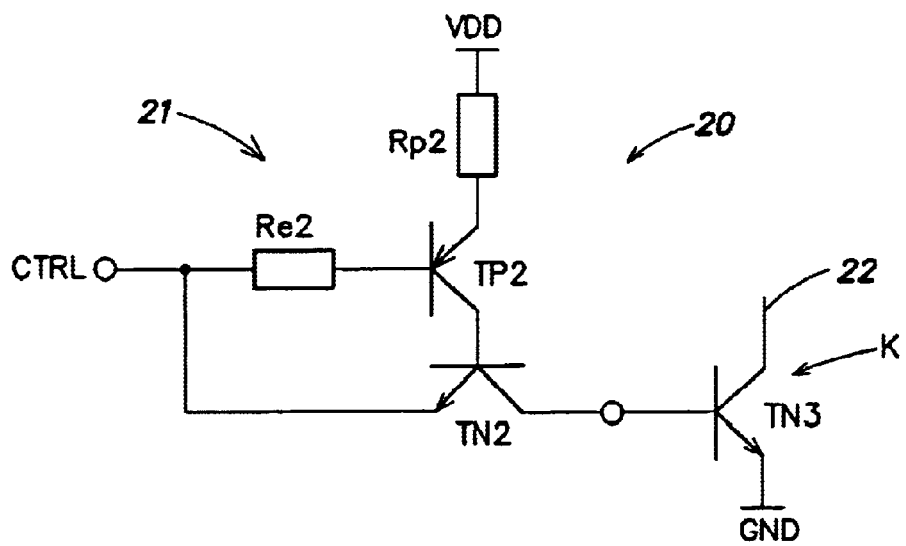
FIG. 5 shows a first embodiment of a switching circuit according to the present invention.

FIG. 5 shows a first embodiment of a switching circuit 20 according to the present invention. Control circuit 21 is here formed of a PNP-type transistor TP2 and of an NPN-type transistor TN2. The emitter of transistor TP2 is connected to voltage VDD by a biasing resistor Rp2. The base of transistor TP2 is connected, by a resistor Re2, to input or control terminal CTRL of circuit 21. The collector of transistor TP2 is connected to the base of transistor TN2. The emitter of transistor TN2 is connected to terminal CTRL and its collector provides the output signal of block 21.

In the example of FIG. 5, switch K is formed of an NPN-type transistor TN3 having its base connected to the collector of transistor TN2 and having its emitter connected to ground GND. The collector of transistor TN3 forms an output terminal 22 of switching circuit 20.

The operation of the switching circuit of FIG. 5 will be discussed hereafter in relation with its application in a logic circuit such as illustrated in FIG. 4.

Figure 6:
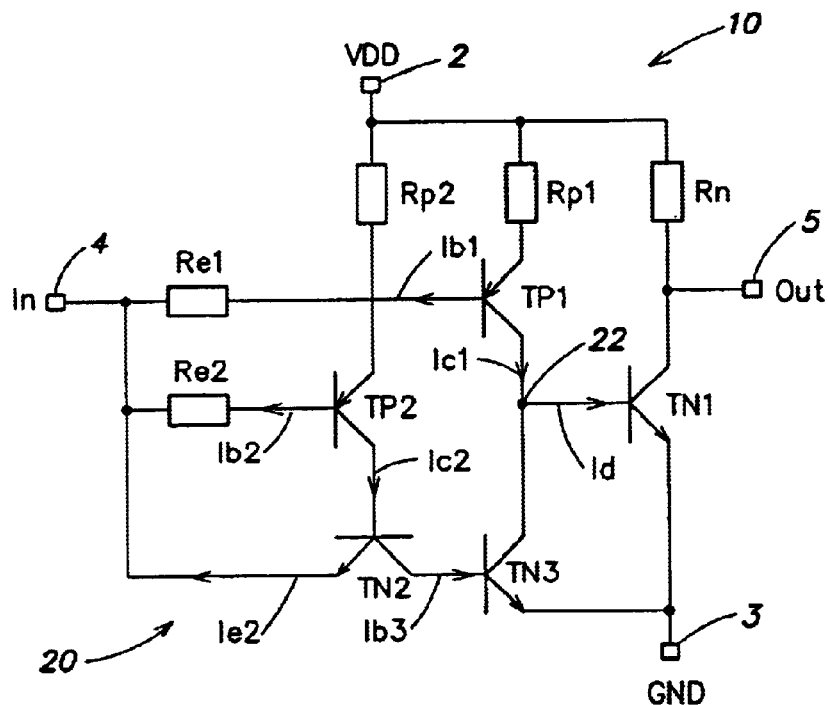
FIG. 6 shows the detailed electric diagram of an embodiment of the logic circuit of FIG. 4.

FIG. 6 shows the detailed electric diagram of such a circuit. It shows the components of the logic circuit discussed in relation with FIG. 4 as well as the components of the switching circuit of FIG. 5. Input terminal 4 is connected to resistors Re1 and Re2 and to the emitter of transistor TN2. Terminal 22 of circuit 20 (collector of transistor TN3) is connected to the collector of transistor TP1 and to the base of transistor TN1. The emitter of transistor TN3 is connected to terminal 3 and resistor Rp2 is connected to terminal 2. It should be noted that the assembly of transistor TP2 is close to that of transistor TP1. The two transistors receive the input signal via an input resistor and are biased by their respective emitters to voltage VDD.

In static operation, the operation of a non-inverting logic circuit is respected.

Assume an input IN at the high state. Transistor TP1 is then off. Transistor TN1 can receive no base current and is thus also off. Signal OUT then is high. On the side of switching circuit 20, transistor TP2 is off. Transistor TN2 receives no base current and is thus also off, and so is transistor TN3. This results in no power consumption in control circuit 20 when the circuit is, in static operation, at the high state. The general circuit power consumption is then limited to the power consumption in resistor Rn. The power consumption of a conventional logic circuit of this type (FIG. 2) is thus respected.

Now assume that input IN is low. In this case, in static operation, transistor TP1 is on. On the side of switching circuit 20, transistor TP2 is biased to be on. The base-emitter junction of transistor TN2 is forward biased and receives a base current. However, since no current can be drawn from the collector of transistor TN2 (the base of transistor TN3), its collector-emitter voltage is minimum (a few tens of mV). Accordingly, the low level is substantially transferred onto the base of transistor TN3, which confirms its off state. Since switch TN3 is off, transistor TN1 is turned on by the turning-on of transistor TP1. Output 5 accordingly is low. In the low state, the logic circuit power consumption corresponds to the dissipation in biasing resistors Rp1 and Rp2 and in input resistors Re1 and Re2.

In the assembly of FIG. 6, the function of transistor TN3 is to accelerate the desaturation of transistor TN1 when off. For this purpose, transistor TN3 is turned on when input signal IN switches high. However, to prevent the continuous power consumption of the assembly, transistor TN3 must be turned back off after a short period having enabled desaturation of transistor TN2. This is the function of circuit 21.

Figure 7A:
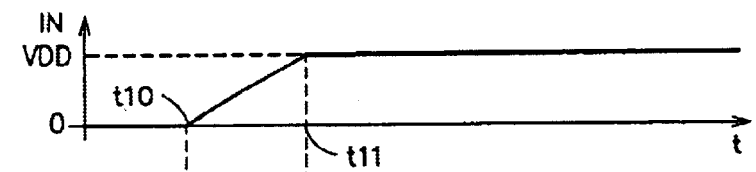
FIGS. 7A to 7I illustrate, by timing diagrams, the dynamic operation of the circuit of FIG. 6.
Figure 7B:
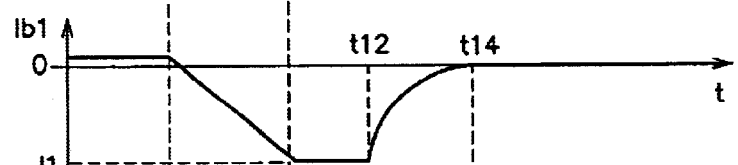
Figure 7C:
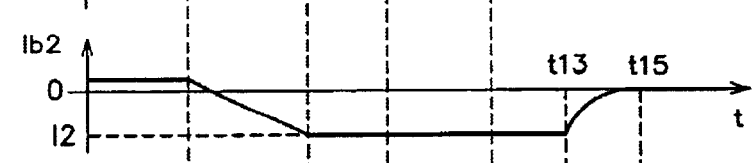
Figure 7D:
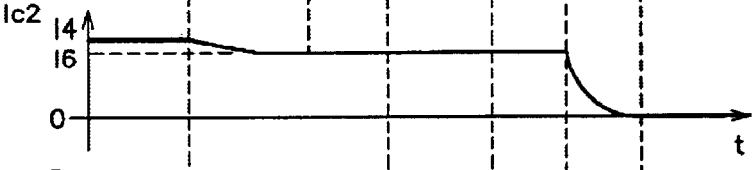
Figure 7E:
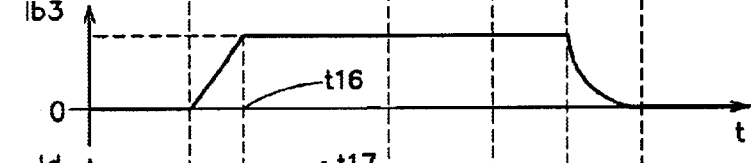
Figure 7F:
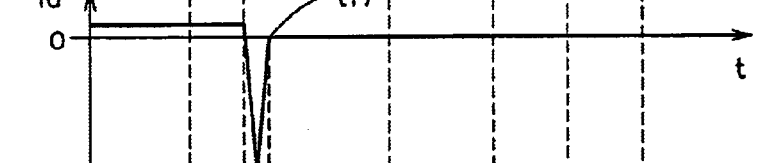
Figure 7G:
Figure 7H:
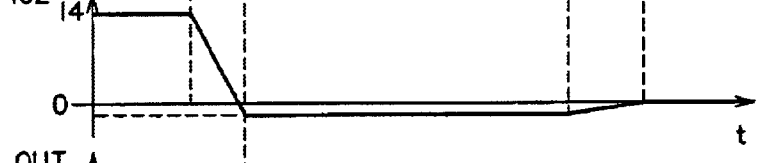
Figure 7I:
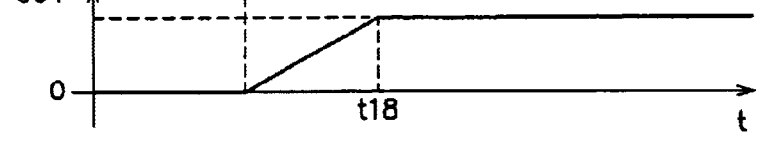

FIGS. 7A to 7I illustrate, in timing diagrams, the dynamic operation of the circuit of FIG. 6 upon switching of input signal IN from the low state to the high state. FIG. 7A shows the course of input voltage IN. FIGS. 7B to 7H show the courses of currents Ib1, Ib2, Ic2, Ib3, Id, Ic1, and Ie2 in, respectively, the base of transistor TP1, the base of transistor TP2, the collector of transistor TP2 (and thus the base of transistor TN2), the base of transistor TN3 (and thus the collector of transistor TN2), the base of transistor TN1, the collector of transistor TP1, and the emitter of transistor TN2. FIG. 7I shows the course of output voltage OUT. The directions taken for the drawing of the currents in FIGS. 7B to 7H are shown in FIG. 6.

Initially, signals IN and OUT are low. Transistors TP1, TP2, TN1, and TN2 are thus on. Accordingly, positive base currents Ib1, Ib2, and Id flow through transistors TP1 and TP2 (coming out of the bases) and into transistor TN1 (coming into the base). Positive collector currents Ic1 and Ic2 flow through transistors TP1 and TP2 (coming out of the collectors). Finally, a positive emitter current (coming out of the emitter) flows in transistor TN2.

A switching of signal IN is assumed from a time t10. The switching of signal IN lasts until a time t11 when the voltage reaches the high level (for example, VDD). Interval t10–t11 generally is on the order of 0.1 μs. Between times t10 and t11, base currents Ib1 and Ib2 decrease until reaching negative values I1 and I2, for which transistors TP1 and TP2 desaturate. Values I1 and I2 depend on the transistor sizes and on the values of resistances Re1 and Re2, respectively. The durations (times t11 to t12 and t11 to t13, respectively) for which values I1 and I2 are maintained depend on the time taken by transistors TP1 and TP2 to desaturate. From time t12 for transistor TP1 and from time t13 for transistors TP2, base currents Ib1 and Ib2 tend towards zero. They annul at times t14 and t15 when transistors TP1 and TP2 are respectively off.

On the side of transistor TP2, its turning off comes along with an evacuation of the charges of its collector, and thus with a decrease in its collector current. The evacuation of these charges occurs through the base-collector junction of transistor TN2, which is thus forward biased. Indeed, transistor TN3 being initially off, its base (and thus the collector of transistor TN2) is at a voltage smaller than approximately 0.6 V. Now, as long as transistor TP2 is not off, the base of transistor TN2 is drawn towards voltage VDD (neglecting the voltage drop in resistor Rp2).

The current which is then injected into the base of transistor TN3 is sufficient to turn it on at a time t16 very close to time t10 (for example, a few tens of nanoseconds after time t10). From time t16, transistor TN3 being on, the base of transistor TN1 and the collector of transistor TP1 are drawn towards the ground. For transistor TN1, this translates as an abrupt desaturation during which its base current Id becomes very negative until a time t17 when it annuls, all charges having been evacuated. For transistor TP1, this translates as a shift in the shape of its collector current. Between times t10 and t16, the charges of the collector of transistor TP1 evacuate through the base of transistor TN1, that is, relatively slowly. From time t16, the collector current strongly increases until reaching, at time t17, a maximum value I3. Value I3 depends on the gain of transistor TP1 and on value I1 of its base current.

From time t17, transistor TN3 absorbs the desaturation of transistor TP1, but transistor TN1 is off. Accordingly, voltage OUT starts increasing until a time t18 when it reaches level VDD. On the side of transistor TP1, the collector current remains at value I3 until time t12, then decreases to annul at time t14 when all the collector charges have been evacuated.

Time interval t17–t18 is independent from the circuit of the present invention. It depends on the charge connected on terminal 5. In applications concerning the present invention, interval t17–t18 generally is shorter than one microsecond. However, while the desaturation of transistor TN1 takes approximately 1 µs in a conventional circuit, this duration is, due to the present invention, brought down to a few tens of nanoseconds (less than 0.1 µs). This duration is adjusted by the value of resistor Re2.

Transistor TN3 remains on as long as transistor TP2 is not off, that is, as long as its has not absorbed, through its base, all the collector charges of transistor TP2. From time t15, transistor TN3 is off, since no further current can be injected onto its base.

Between times t10 and t16, emitter current Ie2 of transistor TN2 switches from a positive value I4 to a very low negative value (leakage current in the reverse-biased base-emitter junction), then decreases from time t13, to annul at time t15. Value I4 substantially corresponds to the value of current Ic2 evacuated by the emitter when transistor TN2 is on.

Between times t10 and t11, current Ic2 increases from value I4 to a value I6, before annulling between times t13 and t15. Value I6 depends on the gain of transistor TP2 and on value I2.

The conduction duration of transistor TN3 essentially depends on the time taken by transistor TP2 to desaturate into transistor TN2. Accordingly, this duration depends on the size of transistor TP2 (on its emitter surface area) and on its saturation level, and thus on the value of resistor Re2.

In the circuit sizing, it will be ascertained that transistor TP2 takes longer to turn off than transistor TP1. Otherwise, transistor TN1 risks being turned by on at the turning-off of transistor TN3. In a specific example of embodiment where transistors TP2 and TP1 have identical sizes and identical biasings, resistance Re2 may be sized to correspond to twice the value of resistance Re1.

When the input signal switches from the high state to the low state, transistor TP1 is conventionally turned on (saturated). Since transistor TN3 is off, transistor TN1 is turned on. The switching speed is not altered by the implementation of the present invention. Conversely, since transistor TN1 can now be rapidly desaturated, the base current can be increased to turn it on and thus also increase the switching from the high state to the low state. On the switching circuit side, transistor TP2 is properly biased to be on, and so is transistor TN2. However, since transistor TN2 cannot draw a base current from transistor TN3, the off state of transistor TN3 is confirmed.

The minimum circuit supply voltage is determined by the maximum voltage between the sum of the base-collector voltage of transistor TN1 and of the collector-emitter voltage of transistor TP1 and the sum of the base-emitter voltage of transistor TN2, of the collector-emitter voltage of transistor TP2, and of level IN in the low state.

The shown connection of transistor TP2 implies that input terminal 4 is connected to a current output type circuit (open collector). The specific assembly of transistor TP2 is a precaution to avoid favoring the parasitic thyristor that it forms with transistor TN2. In the case where terminal 4 is connected to a circuit having a voltage output, this problem is not posed since the voltages are imposed. Transistor TP2 can thus be inverted (emitter connected to the base of transistor TN2 and collector connected to resistor Rp2).

An advantage of the present invention according to its first aspect is that it considerably increases the switching speed of the non-inverting logic circuit.

Another advantage of the present invention is that this speed is obtained neither at the detriment of the power consumption, nor at the detriment of the supply voltage.

More generally, an advantage of the switching circuit according to the present invention is that it provides an integrable solution for generating pulses of predetermined duration.

Figure 8:
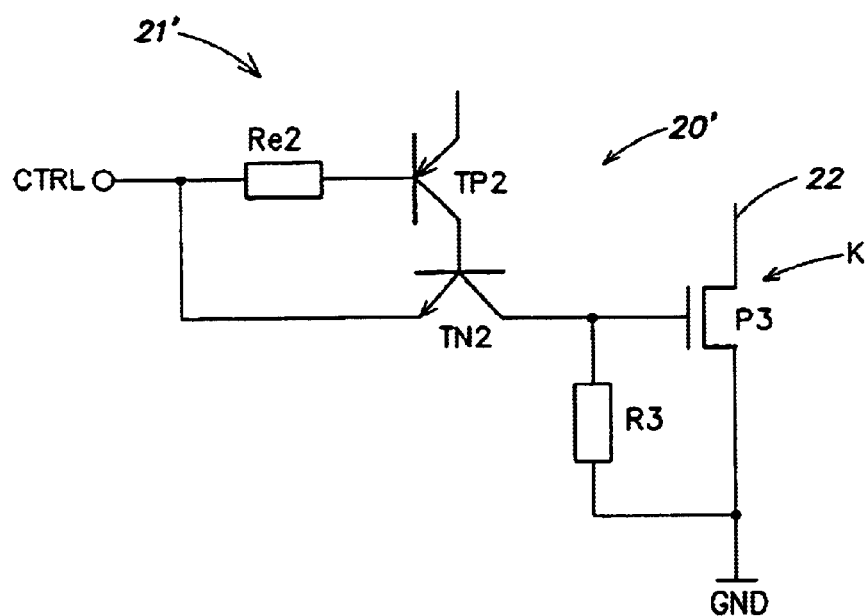
FIG. 8 shows a second embodiment of a switching circuit according to the present invention.

FIG. 8 shows a second embodiment of a switching circuit 20' according to the present invention. This embodiment is different from that of FIG. 5 essentially in that it uses a MOS transistor to form transistor K. It is a P-channel MOS transistor P3 having its gate connected to the collector of bipolar transistor TN2. A resistor R3 connects the gate of MOS transistor P3 to its grounded source to be used as a current-to-voltage converter, to temporarily turn on transistor P3 by the desaturating of transistor TN2.

However, the use of a bipolar technology is a preferred embodiment of the present invention since it is less expensive and less sensitive to electromagnetic disturbances.

Figure 9:
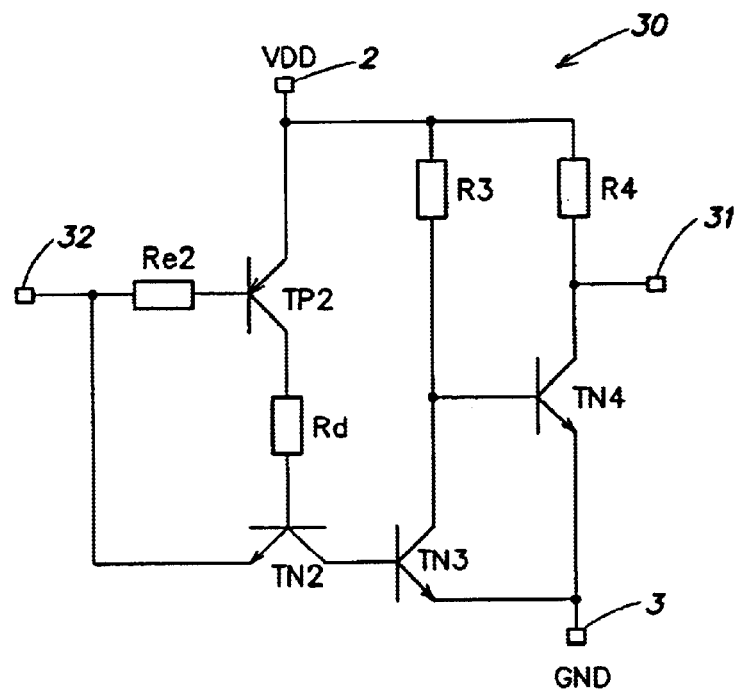
FIG. 9 shows an embodiment of a pulse generation circuit according to the second aspect of the present invention.

FIG. 9 shows the electric diagram of a pulse generator circuit 30 according to a second aspect of the present invention. The switching circuit of the present invention here is used to generate a pulse, on an output terminal 31, upon each rising edge of a logic signal introduced on an input terminal 32. Generator 30 includes transistor TN2 having its base connected to transistor TN3, the collector of which provides the pulse signal and the emitter of which is connected to ground terminal 3. The base of transistor TN2 is connected to transistor TP2 by a resistor Rd. The emitter of transistor TP2 here is directly connected to terminal 2 of application of supply voltage VDD. The base of transistor TP2 is connected, by resistor Re2, to input terminal 32. In this aspect of the present invention, the collector of transistor TN3 is connected to terminal 2 by a resistor R3. To provide a pulse of same sign as the input signal, stage R3-TN3 of circuit 30 is reproduced on an output branch forming an inverter. Accordingly, the collector of transistor TN3 is connected to the base of an NPN-type transistor TN4. The emitter of transistor TN4 is connected to terminal 3. Its collector is connected to terminal 31 and, via a resistor R4, to terminal 2.

Figure 10A:
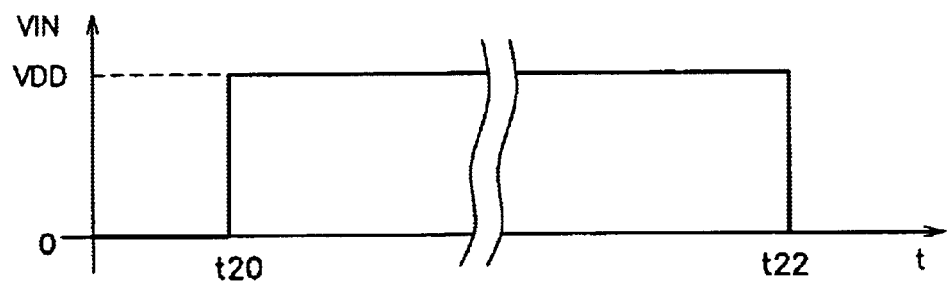
FIGS. 10A and 10B illustrate, in the form of timing diagrams, the operation of the circuit of FIG. 9.
Figure 10B:
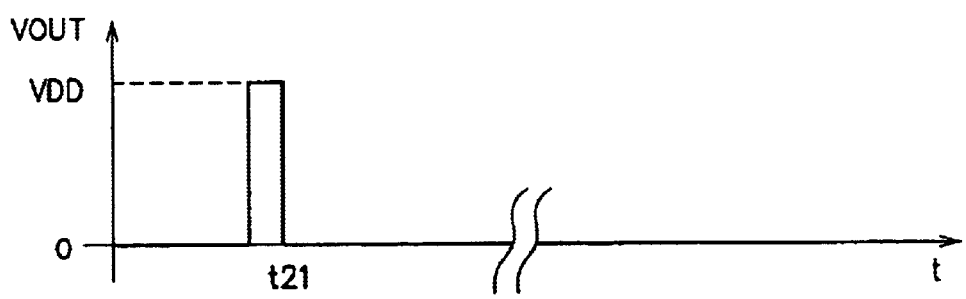

The operation of the pulse generator of FIG. 9 is illustrated by FIGS. 10A and 10B, which show, in the form of timing diagrams, an example of generation of a pulse based on a state switching of an input signal VIN.

Assume that at a time t20, signal VIN (FIG. 10A) applied on terminal 32 switches from the low state to the high state (VDD). Transistor TP2 is turned off by the disappearing of its base-emitter voltage. Transistor TN2, the emitter of which also receives signal Vin, also turns off. The base-collector junction of transistor TN2 is then used to desaturate transistor TP2 in resistor Rd. This turns on transistor TN3 and turns off transistor TN4. The output switches high. This state is maintained for the time necessary to desaturate transistor TP2. At a time t21 where transistor TP2 is assumed to have ended its desaturation into the base of transistor TN2, said transistor turns off, which turns off transistor TN3 and causes the switching of the output.

The pulse generator of the present invention only generates a pulse on the rising edges of the input signal. As discussed in relation with the first aspect of the present invention, transistor TN3 remains off upon occurrence of a falling edge (time t22).

The duration of the generated pulse depends on the saturation of transistor TP2, which is a function of the value of resistance Re2. The higher this value, the lighter the saturation and the shorter the desaturation time. Resistor Rd is thus used to limit the collector current of transistor TP2. It thus also takes part in the duration of the output pulse. A generator according to the present invention can be sized, by remaining integrable, for a pulse duration of approximately 10 µs.

According to an alternative not shown, transistor TP2 may be replaced with a P-channel MOS transistor to slow the desaturation down, provided to always use a bipolar transistor, the base-collector junction of which is used to temporarily turn on the output transistor desaturation switch.

An advantage of the pulse generator illustrated in FIG. 9 is that it avoids use of capacitors to generate a pulse from a voltage square pulse. Even with a resistance Re2 on the order of some hundred kilo ohms, the occupied space is lesser than that of a capacitor on the order of 10 picofarads that it would be necessary to provide to obtain a pulse of a few microseconds.

Another advantage of the pulse generator according to the present invention is that it has a low power consumption. In its quiescent state, the power consumption is essentially due to the emitter current of transistor TN2, and thus is a function of the value of resistor Rd providing the base current of this transistor. The current in resistor Re2 is negligible since it corresponds to the base current of transistor TP2. The power consumption of the generator of the present invention is very low as compared, for example, to that of a one-shot circuit, which is another conventional means of pulse generation.

Of course, the present invention is likely to have various alterations, modifications, and improvements which will readily occur to those skilled in the art. In particular, the sizing of the transistors and resistors is within the abilities of those skilled in the art based on the functional indications given hereabove and on the application. Further, although the present invention has been discussed in relation with the generation of positive pulses, its transposing to a negative pulse generation is within the abilities of those skilled in the art.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A switching circuit capable of generating a pulse upon occurrence of a rising edge of a signal applied on an input terminal, including:
    a first NPN-type bipolar transistor having its emitter connected to the input terminal;
    a second transistor having a control electrode connected, by a first resistor, to the input terminal, a base of the first transistor being connected to a supply voltage by the second transistor in series with a second resistor; and
    a third transistor connecting an output terminal of the switching circuit to a reference voltage and having a control electrode connected to a collector of the first transistor.

2. The switching circuit of claim 1, wherein the first and second transistors are on in a quiescent state, while the third transistor is off in the quiescent state.

3. The switching circuit of claim 1 or 2, wherein a pulse duration is determined by a time taken by the second transistor (TP2) to turn off through the base-collector junction of the first forward-biased transistor and temporarily turning on the third transistor.

4. The switching circuit of claim 1, wherein the pulse duration is set by the first resistor.

5. The switching circuit of claim 1, wherein the second transistor is a bipolar PNP-type transistor.

6. The switching circuit of claim 1, wherein the third transistor is a bipolar NPN-type transistor.

7. A logic circuit that provides a non-inverting function, including:
    a bipolar PNP type input transistor having its emitter connected, by a biasing resistor, to a terminal of application of a positive voltage and having a base connected, by an input resistor, to an input terminal of a logic signal;
    a bipolar NPN type output transistor having an emitter connected to an input terminal of a reference voltage, having base connected to a collector of the input transistor and a collector forming an output terminal of the logic circuit connected, by an output resistor, to the terminal receiving the positive voltage;
    and including the switching circuit of claim 1, the output terminal of the switching circuit being connected to a base of the output transistor to accelerate its desaturation, the input terminal of the switching circuit being connected to the input terminal of the logic circuit.

8. The logic circuit of claim 7, wherein the second resistor is connected between the first transistor and the terminal receiving the positive voltage, the collector of the first transistor being directly connected to the base of the second transistor.

9. A generator of pulses from a voltage square pulse applied on an input terminal, including the switching circuit of claim 1, having its output terminal forming an output terminal of the pulse generator connected, by a resistor, to a terminal of application of the most positive voltage.

10. The pulse generator of claim 9, wherein the collector of the first transistor is connected to the base of the second transistor by the second resistor conditioning the pulse duration.

* * * * *

UNITED STATES PATENT AND TRADEMARK OFFICE
CERTIFICATE OF CORRECTION

PATENT NO.    : 6,882,180 B2
DATED         : April 19, 2005
INVENTOR(S)   : Franck Duclos, Olivier Ladiray and Jérôme Heurtier It is certified that error appears in the above-identified patent and that said Letters Patent is hereby corrected as shown below:

Column 8,
Between lines 22-24, insert -- Initially, transistor TP2 is on, its base being grounded. Transistor TN2 accordingly is also on, which guarantees the off state of transistor TN3. Transistor TN4 thus is on. As a result, the state of output 31 is low (signal VOUT, Fig. 10B) --

Column 10,
Line 55, insert the following claims:

11. A switching circuit capable of generating a pulse upon occurrence of a rising edge of a signal applied on an input terminal, comprising:
  a first transistor coupled to the input terminal;
  a second transistor having a control terminal coupled, by a first resistor, to the input terminal, the second transistor coupling a supply voltage terminal to the first transistor through a second resistor; and
  a third transistor that couples an output terminal of the switching circuit to a reference voltage terminal and having a control terminal coupled to the first transistor.

12. The switching circuit of claim 12, wherein the first transistor comprises an NPN transistor.

13. The switching circuit of claim 12, wherein the second transistor is a PNP transistor.

14. The switching circuit of claim 13, wherein the third transistor is an NPN transistor.

Signed and Sealed this

Seventh Day of June, 2005

JON W. DUDAS
*Director of the United States Patent and Trademark Office*

UNITED STATES PATENT AND TRADEMARK OFFICE
CERTIFICATE OF CORRECTION

PATENT NO.  : 6,882,180 B2
DATED       : April 19, 2005
INVENTOR(S) : Franck Duclos, Olivier Ladiray and Jérôme Heurtier It is certified that error appears in the above-identified patent and that said Letters Patent is hereby corrected as shown below:

Column 8,
Between lines 46-47, insert:
-- Initially, transistor TP2 is on, its base being grounded. Transistor TN2 accordingly is also on, which guarantees the off state of transistor TN3. Transistor TN4 thus is on. As a result, the state of output 31 is low (signal VOUT, Fig. 10B) --.

Column 10,
Line 55, insert the following claims:

11. A switching circuit capable of generating a pulse upon occurrence of a rising edge of a signal applied on an input terminal, comprising:
a first transistor coupled to the input terminal;
a second transistor having a control terminal coupled, by a first resistor, to the input terminal, the second transistor coupling a supply voltage terminal to the first transistor through a second resistor; and
a third transistor that couples an output terminal of the switching circuit to a reference voltage terminal and having a control terminal coupled to the first transistor.

12. The switching circuit of claim 11, wherein the first transistor comprises an NPN transistor.

13. The switching circuit of claim 12, wherein the second transistor is a PNP transistor.

14. The switching circuit of claim 13, wherein the third transistor is an NPN transistor.

15. The switching circuit of claim 11, wherein the first and second transistors are on a quiescent state while the third transistor is off in the quiescent state.

16. The switching circuit of claim 11, wherein a duration of the pulse is determined by a time taken by the second transistor to turn off by discharging through the first transistor.

UNITED STATES PATENT AND TRADEMARK OFFICE
CERTIFICATE OF CORRECTION

PATENT NO. : 6,882,180 B2
DATED : April 19, 2005
INVENTOR(S) : Franck Duclos, Olivier Ladiray and Jérôme Heurtier It is certified that error appears in the above-identified patent and that said Letters Patent is hereby corrected as shown below:

Column 10 (cont'd),
17. The switching circuit of claim 11, in combination with a pulse generator.

Signed and Sealed this

Fourth Day of October, 2005

JON W. DUDAS
*Director of the United States Patent and Trademark Office*